(12) United States Patent
Barabas et al.

(10) Patent No.: US 11,973,471 B2
(45) Date of Patent: Apr. 30, 2024

(54) METHOD AND SYSTEM FOR PROCESS AND TEMPERATURE COMPENSATION IN A TRANSIMPEDANCE AMPLIFIER USING A DUAL REPLICA

(71) Applicant: Cisco Technology, Inc., San Jose, CA (US)

(72) Inventors: Stefan Barabas, West Melbourne, FL (US); Joseph Balardeta, Encinitas, CA (US); Simon Pang, San Diego, CA (US); Scott Denton, Escondido, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 18/158,791

(22) Filed: Jan. 24, 2023

(65) Prior Publication Data
US 2023/0163729 A1 May 25, 2023

Related U.S. Application Data

(63) Continuation of application No. 17/071,950, filed on Oct. 15, 2020, now Pat. No. 11,588,445, which is a
(Continued)

(51) Int. Cl.
*H03F 1/30* (2006.01)
*H01L 31/02* (2006.01)
(Continued)

(52) U.S. Cl.
CPC ......... *H03F 1/30* (2013.01); *H01L 31/02016* (2013.01); *H01L 31/09* (2013.01);
(Continued)

(58) Field of Classification Search
CPC . H03F 1/30; H03F 1/086; H03F 1/301; H03F 1/56; H03F 3/08; H03F 3/082; H03F 3/087; H03F 2200/129; H03F 2200/132; H03F 2200/156; H03F 2200/453; H01L 31/02016; H03G 3/3084
See application file for complete search history.

(56) References Cited

U.S. PATENT DOCUMENTS 7,518,447 B1 * 4/2009 Tan .................. H03F 3/505
330/285

* cited by examiner

*Primary Examiner* — Georgia Y Epps
*Assistant Examiner* — Don J Williams
(74) *Attorney, Agent, or Firm* — Patterson + Sheridan, LLP

(57) ABSTRACT

The present disclosure provides for process and temperature compensation in a transimpedance amplifier (TIA) using a dual replica via monitoring an output of a first TIA (transimpedance amplifier) and a second TIA; configuring a first gain level of the first TIA based on a feedback resistance and a reference current applied at an input to the first TIA; configuring a second gain level of the second TIA and a third TIA based on a control voltage; and amplifying a received electrical current to generate an output voltage using the third TIA according to the second gain level. In some embodiments, one or both of the second TIA and the third TIA include a configurable feedback impedance used in compensating for changes in the second gain level due to a temperature of the respective second or third TIA via the configurable feedback impedance of the respective second or third TIA.

20 Claims, 6 Drawing Sheets

Related U.S. Application Data continuation of application No. 16/429,952, filed on Jun. 3, 2019, now Pat. No. 10,855,229, which is a continuation of application No. 14/997,940, filed on Jan. 18, 2016, now Pat. No. 10,312,866.

(60) Provisional application No. 62/125,292, filed on Jan. 16, 2015.

(51) Int. Cl.
*H01L 31/09* (2006.01)
*H03F 1/08* (2006.01)
*H03F 1/56* (2006.01)
*H03F 3/08* (2006.01)
*H03G 3/30* (2006.01)

(52) U.S. Cl.
CPC ............. *H03F 1/086* (2013.01); *H03F 1/301* (2013.01); *H03F 1/56* (2013.01); *H03F 3/08* (2013.01); *H03F 3/082* (2013.01); *H03F 3/087* (2013.01); *H03G 3/3084* (2013.01); *H03F 2200/129* (2013.01); *H03F 2200/132* (2013.01); *H03F 2200/156* (2013.01); *H03F 2200/453* (2013.01)

METHOD AND SYSTEM FOR PROCESS AND TEMPERATURE COMPENSATION IN A TRANSIMPEDANCE AMPLIFIER USING A DUAL REPLICA

CROSS-REFERENCE TO RELATED APPLICATIONS

This application is a continuation of co-pending U.S. patent application Ser. No. 17/071,950, filed on Oct. 15, 2020, which is a continuation of U.S. patent application Ser. No. 16/429,952, filed on Jun. 3, 2019, which issued on Dec. 1, 2020 as U.S. Pat. No. 10,855,229, which is a continuation of U.S. patent application Ser. No. 14/997,940, filed on Jan. 18, 2016 which issued on Jun. 4, 2019 as U.S. Pat. No. 10,312,866, and claims priority to and the benefit of U.S. provisional application Ser. No. 62/125,292, filed on Jan. 16, 2015. The aforementioned related patent application is herein incorporated by reference in its entirety.

FIELD

Certain embodiments of the disclosure relate to semiconductor electronics. More specifically, certain embodiments of the disclosure relate to a method and system for process and temperature compensation in a transimpedance amplifier using a dual replica and servo loop.

BACKGROUND

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for process and temperature compensation in a transimpedance amplifier using a dual replica and servo loop, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Certain aspects of the disclosure may be found in a method and system for process and temperature compensation in a transimpedance amplifier using a dual replica and servo loop. Exemplary aspects of the disclosure may comprise a method performed by a transimpedance amplifier (TIA) circuit comprising a first TIA, a second TIA, a third TIA, and a control loop. The first TIA comprises a fixed feedback resistance and the second and third TIAs each comprise a configurable feedback impedance. The control loop comprises a gain stage with inputs coupled to outputs of the first and second TIAs and with an output coupled to the configurable feedback impedance of the second and third TIAs. The method steps may comprise, for example, configuring a gain level of the first TIA based on the fixed feedback resistance and a reference current applied at an input to the first TIA, configuring a gain level of the second and third TIAs based on a control voltage generated by the gain stage, and amplifying a received electrical current to generate an output voltage using the third TIA. The reference current may generate a reference voltage at one of the inputs of the gain stage. The reference voltage may control the output of the gain stage that is coupled to the configurable feedback impedances of the second and third TIAs. Gain level changes with temperature of the second and third TIAs may be compensated for, utilizing the configurable feedback impedances of the second and third TIAs, respectively. The configurable impedances of the second and third TIAs each may comprise a fixed resistor and a voltage-controlled resistance. The configurable impedances of the second and third TIAs may be configured by configuring a gate voltage of a transistor of the voltage-controlled resistance utilizing the output of the gain stage. The output voltage may be coupled to a first input of a second gain stage wherein a second input of the second gain stage is coupled to an output of a fourth TIA. A differential signal may be generated utilizing the output voltage and an output of the fourth TIA. The output of the second gain stage may be configured by configuring an input current of the third TIA. The electrical signal may be received from a photodetector.

Figure 1A:
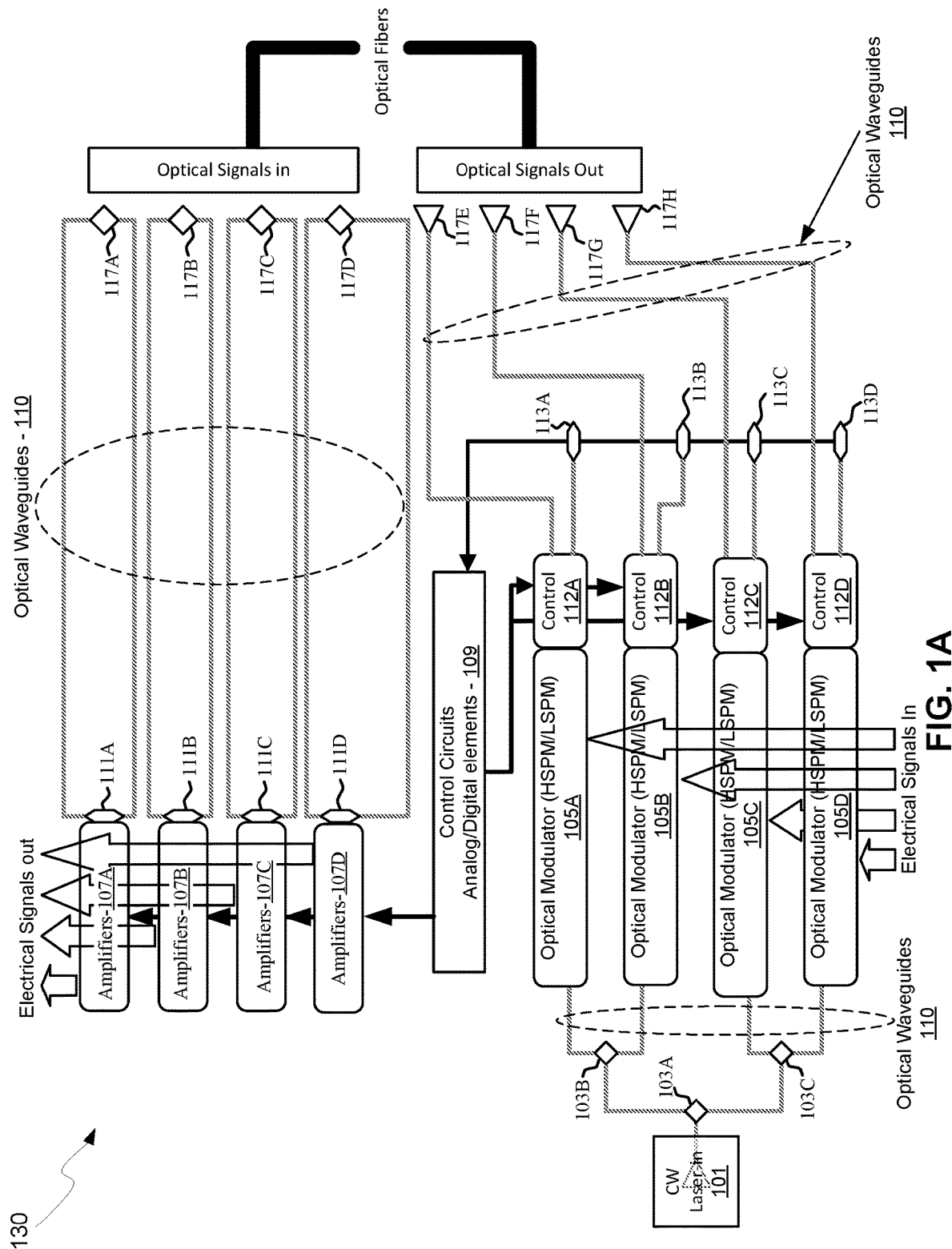
FIG. 1A is a block diagram of a photonically-enabled integrated circuit with process and temperature compensation in a transimpedance amplifier using a dual replica and servo loop, in accordance with an example embodiment of the disclosure.

FIG. 1A is a block diagram of a photonically-enabled integrated circuit with process and temperature compensation in a transimpedance amplifier using a dual replica and servo loop, in accordance with an example embodiment of the disclosure. Referring to FIG. 1A, there are shown optoelectronic devices on a photonically-enabled integrated circuit 130 comprising optical modulators 105A-105D, photodiodes 111A-111D, monitor photodiodes 113A-113D, and optical devices comprising couplers 103A-103C and grating couplers 117A-117H. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example.

In an example scenario, the photonically-enabled integrated circuit 130 comprises a CMOS photonics die with a laser assembly 101 coupled to the top surface of the IC 130. The laser assembly 101 may comprise one or more semiconductor lasers with isolators, lenses, and/or rotators for directing one or more continuous-wave (CW) optical signals to the coupler 103A. A CW optical signal may comprise an unmodulated optical signal comprising a coherent frequency component at a wavelength $\lambda_1$, for example. The photonically enabled integrated circuit 130 may comprise a single chip, or may be integrated on a plurality of die, such as with one or more electronics die and one or more photonics die.

Optical signals are communicated between optical and optoelectronic devices via optical waveguides 110 fabricated in the photonically-enabled integrated circuit 130. Single-mode or multi-mode waveguides may be used in photonic integrated circuits. Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode. Such one mode may have, for example, a polarization that is TE, which comprises an electric field parallel to the substrate supporting the waveguides. Two typical waveguide cross-sections that are utilized comprise strip waveguides and rib waveguides. Strip waveguides typically comprise a rectangular cross-section, whereas rib waveguides comprise a rib section on top of a waveguide slab. Of course, other waveguide cross section types are also contemplated and within the scope of the disclosure.

In an example scenario, the couplers 103A-103C may comprise low-loss Y-junction power splitters where coupler 103A receives an optical signal from the laser assembly 101 and splits the signal to two branches that direct the optical signals to the couplers 103B and 103C, which split the optical signal once more, resulting in four roughly equal power optical signals.

The optical power splitter may comprise at least one input waveguide and at least two output waveguides. The couplers 103A-103C shown in FIG. 1A illustrate 1-by-2 splitters, which divide the optical power in one waveguide into two other waveguides evenly. These Y-junction splitters may be used in multiple locations in an optoelectronic system, such as in a Mach-Zehnder interferometer (MZI) modulator, e.g., the optical modulators 105A-105D, where a splitter and a combiner are needed, since a power combiner can be a splitter used in reverse.

The optical modulators 105A-105D comprise Mach-Zehnder or ring modulators, for example, and enable the modulation of the continuous-wave (CW) laser input signal. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

In an example scenario, the high-speed optical phase modulators may operate based on the free carrier dispersion effect and may demonstrate a high overlap between the free carrier modulation region and the optical mode. High-speed phase modulation of an optical mode propagating in a waveguide is the building block of several types of signal encoding used for high data rate optical communications. Speed in the several Gb/s may be required to sustain the high data rates used in modern optical links and can be achieved in integrated Si photonics by modulating the depletion region of a PN junction placed across the waveguide carrying the optical beam.

One output of each of the optical modulators 105A-105D may be optically coupled via the waveguides 110 to the grating couplers 117E-117H. The other outputs of the optical modulators 105A-105D may be optically coupled to monitor photodiodes 113A-113D to provide a feedback path. The IC 130 may utilize waveguide based optical modulation and receiving functions. Accordingly, the receiver may employ an integrated waveguide photo-detector (PD), which may be implemented with epitaxial germanium/SiGe films deposited directly on silicon, for example.

The grating couplers 117A-117H may comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

The optical fibers may be epoxied, for example, to the CMOS chip, and may be aligned at an angle from normal to the surface of the photonically-enabled integrated circuit 130 to optimize coupling efficiency. In an example embodiment, the optical fibers may comprise single-mode fiber (SMF) and/or polarization-maintaining fiber (PMF).

Figure 1B:
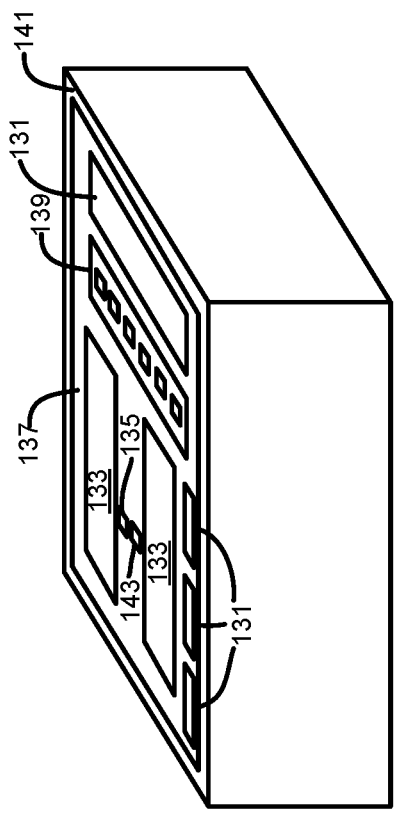
FIG. 1B is a diagram illustrating an exemplary photonically-enabled integrated circuit, in accordance with an example embodiment of the disclosure.
Figure 1B:
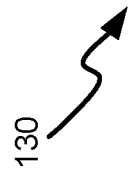

In another exemplary embodiment illustrated in FIG. 1B, optical signals may be communicated directly into the surface of the photonically-enabled integrated circuit 130 without optical fibers by directing a light source on an optical coupling device in the chip, such as the light source interface 135 and/or the optical fiber interface 139. This may be accomplished with directed laser sources and/or optical sources on another chip flip-chip bonded to the photonically-enabled integrated circuit 130.

The photodiodes 111A-111D may convert optical signals received from the grating couplers 117A-117D into electrical signals that are communicated to the amplifiers 107A-107D for processing. In another embodiment of the disclosure, the photodiodes 111A-111D may comprise high-speed heterojunction phototransistors, for example, and may comprise germanium (Ge) in the collector and base regions for absorption in the 1.3-1.6 μm optical wavelength range, and may be integrated on a CMOS silicon-on-insulator (SOI) wafer and/or die.

The analog and digital control circuits 109 may control gain levels or other parameters in the operation of the amplifiers 107A-107D, which may then communicate electrical signals off the photonically-enabled integrated circuit 130. The control sections 112A-112D comprise electronic circuitry that enables modulation of the CW laser signal received from the splitters 103A-103C. The optical modulators 105A-105D may require high-speed electrical signals to modulate the refractive index in respective branches of a Mach-Zehnder interferometer (MZI), for example.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, and subsequently communicated to other electronic circuitry, not shown, in the photonically-enabled integrated circuit 130.

Transimpedance amplifiers (TIAs) may be operable to receive electrical current signals, amplify, and convert them to voltage signals. In optical transceivers, tight gain calibration limits may be imposed on the TIAs, which usually limit the receiver dynamic range (DR), and at data rates beyond 10 GB/s and with input photo current levels in a 30 dB range, linear TIA performance adequate for optoelectronics applications is challenging. The TIA dynamic range may be defined as the ratio of maximum to minimum photocurrent that can be properly sensed.

The TIA linearity limits the receiver cascade dynamic range for large input currents. In scaled CMOS technologies, and under large level input currents, it may be difficult to prevent TIA output saturation due in part to the nonlinearity of the short channel transistors, but mainly to the reduced supply voltages. The low end of the dynamic rage is determined by the TIA input referred noise. A low-noise topology TIA is necessary in order to meet input sensitivity.

A shunt-feedback (SF)-based TIA may provide such a low-noise topology. This architecture is based on a voltage-inverting amplifier with a feedback network. The feedback network impedance directly affects the dynamic range of the TIA and gain may be controlled using a DC control voltage generated in a servo loop using two TIA replicas.

In an example scenario, the TIA topology disclosed herein may control the value of the feedback network impedance, thus enhancing the TIA linearity under large levels of input photocurrent. The gain control method is digital, non-intrusive, i.e. does not affect the signal path, and may be integrated with other process calibration and temperature control mechanisms. Furthermore, process and temperature variation may be compensated for, utilizing an accurately defined feedback impedance for a reference TIA and an active/passive combination for control and main TIAs in the circuit.

FIG. 1B is a diagram illustrating an exemplary photonically-enabled integrated circuit, in accordance with an example embodiment of the disclosure. Referring to FIG. 1B, there is shown the photonically-enabled integrated circuit 130 comprising electronic devices/circuits 131, optical and optoelectronic devices 133, a light source interface 135, a chip front surface 137, an optical fiber interface 139, CMOS guard ring 141, and a surface-illuminated monitor photodiode 143.

The light source interface 135 and the optical fiber interface 139 comprise grating couplers, for example, that enable coupling of light signals via the CMOS chip surface 137, as opposed to the edges of the chip as with conventional edge-emitting/receiving devices. Coupling light signals via the chip surface 137 enables the use of the CMOS guard ring 141 which protects the chip mechanically and prevents the entry of contaminants via the chip edge.

The electronic devices/circuits 131 comprise circuitry such as the amplifiers 107A-107D and the analog and digital control circuits 109 described with respect to FIG. 1A, for example. The optical and optoelectronic devices 133 comprise devices such as the couplers 103A-103C, optical terminations, grating couplers 117A-117H, optical modulators 105A-105D, high-speed heterojunction photodiodes 111A-111D, and monitor photodiodes 113A-113D.

In an example scenario, the electronic devices/circuits 131 may comprise TIAs with accurate gain control using dual replicas and a servo loop. Accordingly, a feedback impedance for the TIA may directly affect the dynamic range of the TIA and gain may be controlled using a DC control voltage generated in the servo loop using two TIA replicas.

Figure 1C:
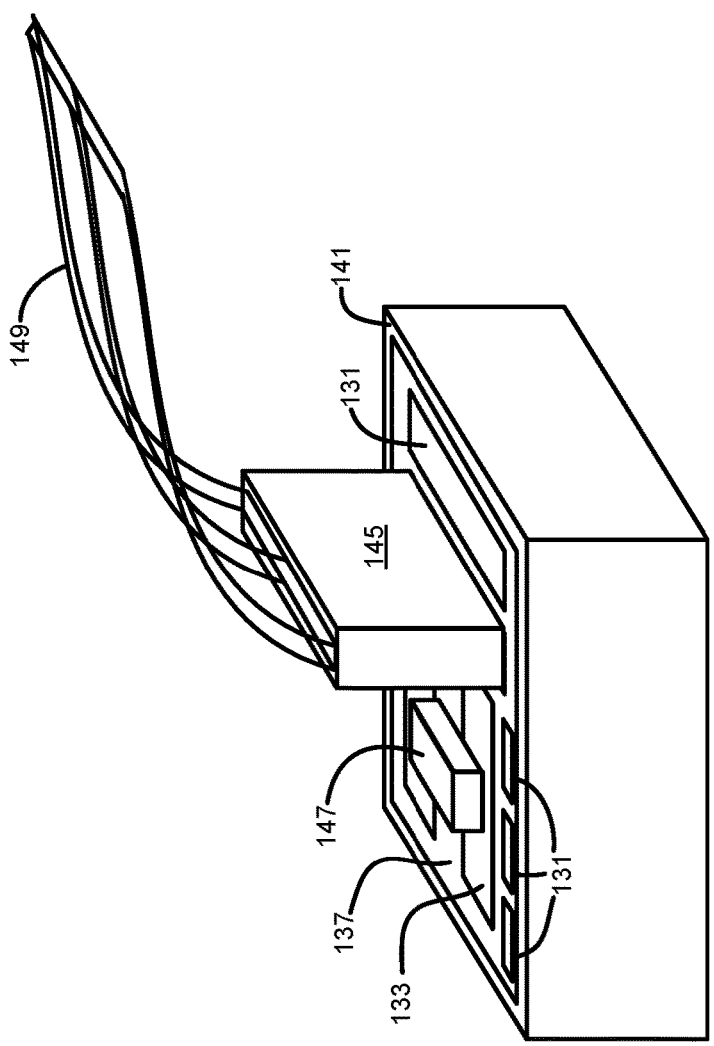
FIG. 1C is a diagram illustrating a photonically-enabled integrated circuit coupled to an optical fiber cable, in accordance with an example embodiment of the disclosure.
Figure 1C:
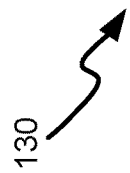

FIG. 1C is a diagram illustrating a photonically-enabled integrated circuit coupled to an optical fiber cable, in accordance with an example embodiment of the disclosure. Referring to FIG. 1C, there is shown the photonically-enabled integrated circuit 130 comprising the chip surface 137 and the CMOS guard ring 141. There are also shown a fiber-to-chip coupler 145, an optical fiber cable 149, and an optical source assembly 147.

The photonically-enabled integrated circuit 130 comprises the electronic devices/circuits 131, the optical and optoelectronic devices 133, the light source interface 135, the chip surface 137, and the CMOS guard ring 141 may be as described with respect to FIG. 1B.

In an example embodiment, the optical fiber cable may be affixed, via epoxy for example, to the CMOS chip surface 137. The fiber chip coupler 145 enables the physical coupling of the optical fiber cable 149 to the photonically-enabled integrated circuit 130.

Figure 2:
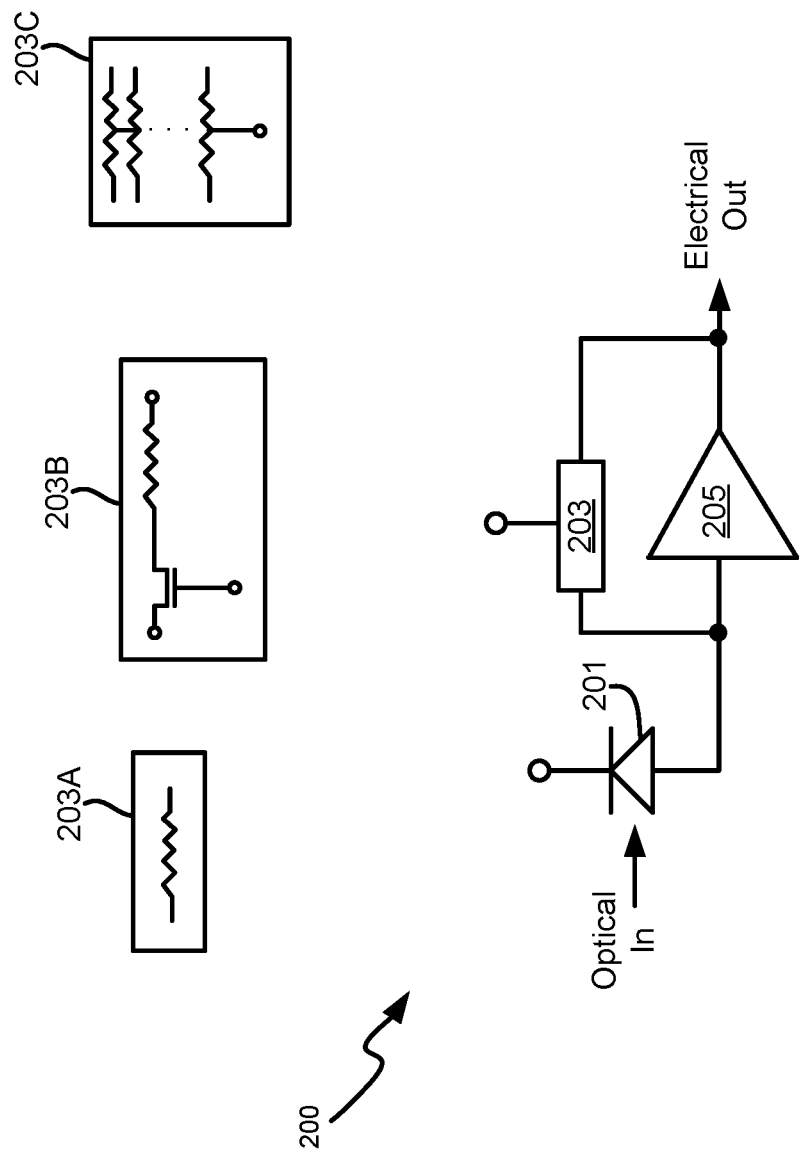
FIG. 2 is a block diagram of a photodiode sensed using a transimpedance amplifier with feedback impedance, in accordance with an example embodiment of the disclosure.

FIG. 2 is a block diagram of a photodiode sensed using a transimpedance amplifier with feedback impedance, in accordance with an example embodiment of the disclosure. Referring to FIG. 2, there is shown receiver front-end 200 comprising a photodetector 201, feedback impedance 203, and a gain stage 205. The photodetector may comprise a semiconductor photodiode, for example, comprising silicon or silicon-germ anium for receiving optical signals and converting them to an electrical current. The photodetector 201 may be on the same chip, such as the chip 130, as the gain stage 205, or may be off-chip.

The gain stage 205 may comprise circuitry for receiving an electrical current signal at its input and providing a voltage at its output that is proportional to the input current. In an example scenario, the gain stage 205 may comprise a voltage-in-voltage-out gain stage and may comprise a CMOS inverter, although the disclosure is not so limited, as any gain stage compatible with the source signal may be utilized.

The feedback impedance 203 may comprise a feedback path for the gain stage 205, and may be implemented in a passive or active mode, with three examples shown by feedback impedances 203A-203C. Feedback impedance 203A comprises a passive impedance with a fixed resistor, while feedback impedances 203B and 203C represent active, or configurable, impedances, where impedance 203B comprises a resistor in series with a transistor. The transistor may comprise a PMOS, NMOS, or other type of transistor, with the control terminal of the transistor being utilized to configure the impedance of the series structure. In an example scenario, an NMOS/PMOS transistor may be utilized and the resistance controlled by varying the gate voltage when operating in its linear region, or triode mode.

Similarly, the feedback impedance 203C comprises an array of selectable resistors, such as a trimmed resistor network. In this example, discrete resistors may be selected utilizing an array of switches coupled to the resistors in the network, as indicated by the input terminal. The variable resistance of the transistor may compensate for changes in the fixed resistor due to temperature change or across process variation. By adjusting the type of triode NMOS, for example, as well as the proportion between the NMOS and the fixed resistor components of the feedback impedance, a reduction in the temperature coefficient of the composite feedback impedance is enabled.

Figure 3:
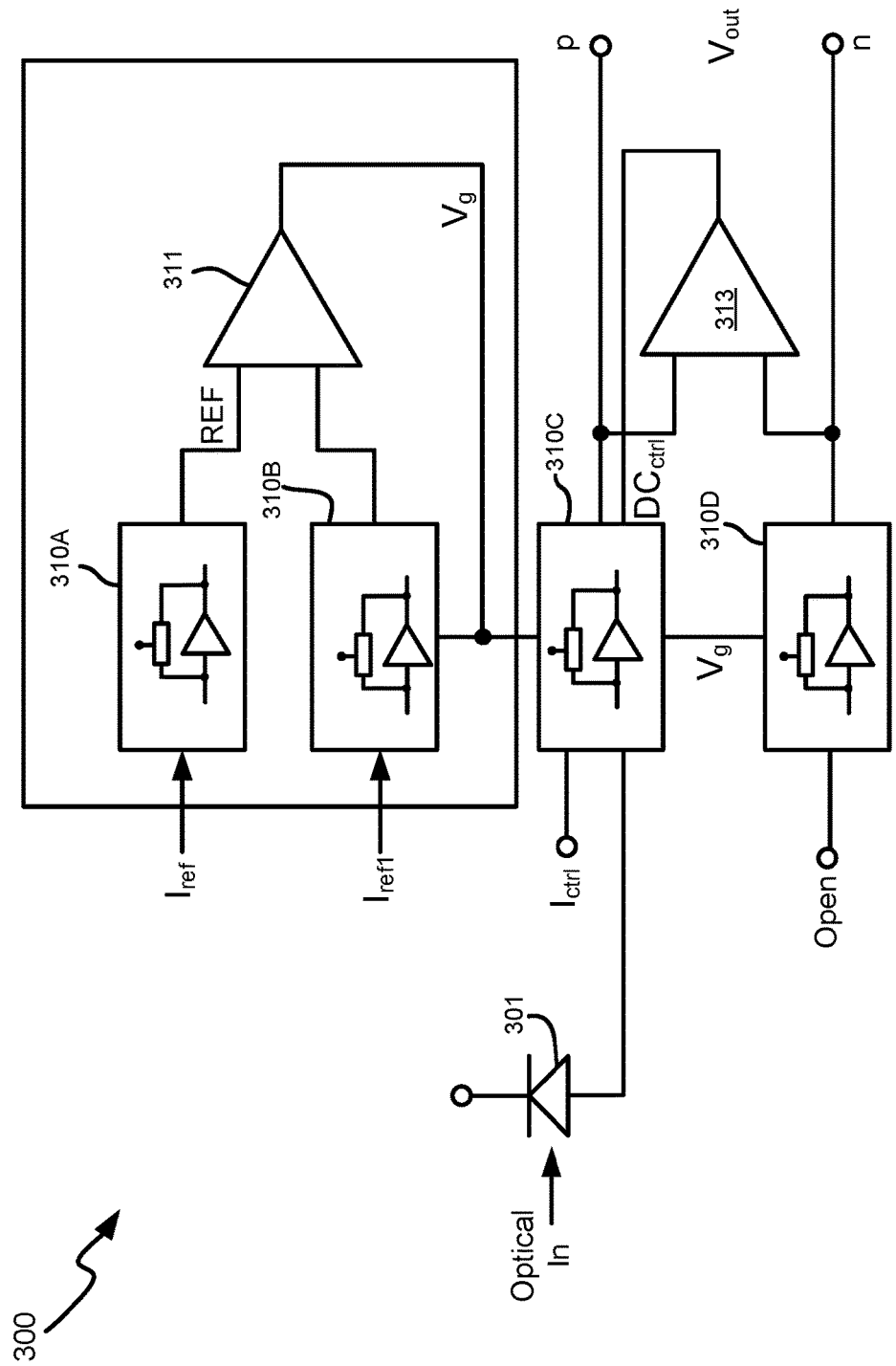
FIG. 3 illustrates a transimpedance amplifier with process and temperature compensation using a dual replica and servo loop, in accordance with an example embodiment of the disclosure.

The feedback impedance 203 and gain stage 205 may be utilized in TIA implementations, as show further with respect to FIG. 3.

FIG. 3 illustrates a transimpedance amplifier with accurate gain adjustment using a dual replica and servo loop, in accordance with an example embodiment of the disclosure. Referring to FIG. 3, there is shown receiver 300 comprising a photodetector 301, TIAs 310A-310D, and amplifiers 311 and 313. There is also shown an optical input signal, a reference voltage $V_{ref}$ at the output of TIA 310A, a control current $I_{ctrl}$ for TIA 310C, a servo loop voltage $V_g$, and an output voltage $V_{out}$.

In an example scenario, the TIAs 310A-310D are substantially similar to the TIA described with respect to FIG. 2, as indicated by the symbols within the boxes for each TIA, where the feedback impedance is configured depending on the function of the TIA. For example, TIA 310A may comprise a trimmed resistor network, such as feedback impedance 203C or a fixed trimmed resistor indicated by feedback impedance 203A, while TIAs 310B, 310C, and 310D each comprise an active feedback impedance, such as feedback impedance 203B. In this manner, the gain of TIA 310A, once selected, may remain essentially constant providing a stable and known gain, while that of TIAs 310B, 310C, and 310D may be configured dynamically using a control voltage, the servo loop voltage $V_g$. The TIAs 310B and 310D may be replicas of TIA 310C, with nominally identical components being located in close proximity on the chip, for example.

The amplifiers 311 and 313 may comprise operational amplifiers or digital feedback, for example, with circuitry that generates an output signal proportional to the difference between its input voltages. For amplifier 311, therefore, the output voltage $V_g$, is proportional to the difference between the output of TIA 310A, REF (a reference voltage, also referred to as $V_{ref}$), and the output of TIA 310B.

The TIA circuit comprising TIAs 310A-310D in the receiver 300 may comprise a CMOS shunt-feedback TIA, whose low-frequency gain (trans-impedance ZT) is correlated to the feedback network impedance. This approximation is correct for a large enough gain for the gain stages in the TIAs 310A-310D, A>10, for example. For A>10, ZT is approximately equal to the feedback impedance.

The main TIA, TIA 310C, and the two TIA replicas, TIAs 310B and 310D in this example, comprise a voltage-controlled feedback impedance, comprising a series combination of a voltage-controlled resistance and a fixed resistor, as shown by impedance 203C in FIG. 2, where the triode-mode n-MOS transistor creates the voltage control portion of the impedance and the poly resistor portion further linearizes the impedance, under overload input signals, as well as compensates the n-MOS temperature coefficient.

The main TIA 310C and TIA replicas 310B and 310D are configured by the servo loop voltage $V_g$, which is coupled to the voltage control inputs of the feedback impedances of the TIAs, thereby providing an accurate representation of a trimmed target feedback impedance. This control voltage $V_g$ imparts the same trimmed impedance value to the impedance networks in the TIA 310C and TIA replicas 310B and 310D, within process and layout matching limits.

The impedance resistance trim servo loop employs a reference TIA 310A that generates an output voltage proportional to $I_{ref}$×target impedance. In an example scenario, $I_{ref}$ and $I_{ref1}$ are small fixed currents, generated by a current digital-to-analog converter (DAC), resulting in a known and accurate current. $I_{ref1}$ and $I_{ref}$ may be injected into TIA 310A and TIA 310B reference inputs, respectively, as a means to increase the matching between the four TIAs, as well as a means to control the TIA 310C gain within a narrow range around the trimmed point.

The main TIA 310C gain may be controlled by the control voltage $V_g$. This voltage in turn may be adjusted by changing the reference voltage (REF) in the servo-loop. REF is generated by the product of $I_{ref}$ and the transimpedance value of the TIA 310A with the trimmed resistance network. The servo-loop equalizes the two voltages seen by the amplifier 311, to the level of REF, generating the control voltage $V_g$. This voltage is proportional to the TIA 310B gain, and it imparts an equal value to the main TIA 310C gain, within matching limits.

The feedback impedance for the reference TIA, TIA 310A, may comprise a trimmed resistor, the resistance value can be configured with a high degree of accuracy, post-fabrication, for each die from a wafer. This accurate reference, in combination with the replica TIA 310B with configurable active feedback impedance and control loop via gain stage 311, results in both accurate and precise gain levels for finished TIA circuits 300 from all die in a wafer, despite process variations. Furthermore, the configurable active resistance in series with the fixed resistance in the feedback impedances results in accurate and precise gain levels with temperature.

Note that the above TIA gain trim approach described here does not affect the high-speed operation of the main TIA 310C in the signal path, since the gain control is applied as a DC voltage on the gate of the feedback n-MOS transistor. This control voltage $V_g$ has a precise value correlated to the trimmed poly resistor, and a temperature coefficient that tracks the same resistor. Also, the control voltage $V_g$ has a variable component, due to its dependence on $I_{ref}$, that is used to control the TIA 310C gain around the trimmed value.

In operation, an optical signal may be directed to the photodetector 301 via an optical waveguide for example, and a resulting electrical signal may be communicated to the TIA 310C. Reference currents $I_{ref}$ and $I_{ref1}$ may be supplied to the inputs of the TIAs 310A and 310B, respectively. The feedback impedance of the TIA 310A, comprising a trim resistor network, may be preselected to configure the gain, while the control voltage $V_g$ acts to equalize the gain of TIA 310B. This same control voltage controls the gain of the main TIA 310C, which receives the electrical signal from the photodetector 301, resulting in an amplified signal $V_{out}$ proportional to the gain of the TIA 310C.

The gain of the main TIA 310C may be adjusted by configuring $I_{ref}$, such that the reference voltage $V_{ref}$ changes and $V_g$ adjusts accordingly to equalize the inputs to the amplifier 311. This change in $V_g$ thus changes the gain of TIA 310C.

In addition, a "pseudo-differential" output may be generated by configuring the output of the amplifier 313 to follow the average of the output signal $V_{out}$. This may be accomplished by coupling the output signal $V_{out}$ to one input of the amplifier 313 and coupling the output of the TIA 310D to the other input of the amplifier 310D. By configuring the current $I_{ctrl}$ for the TIA 310C to sink or source current at the input of the TIA, the DC value of the output voltage $V_{out}$ may be adjusted, and with the input to the TIA 310D being open, the output of the amplifier 313 is therefore inverted from the change in DC value of the output voltage and provides a feedback control voltage, $DC_{ctrl}$. The differential output is therefore defined by the outputs of the TIAs 310C and 310D.

Figure 4:
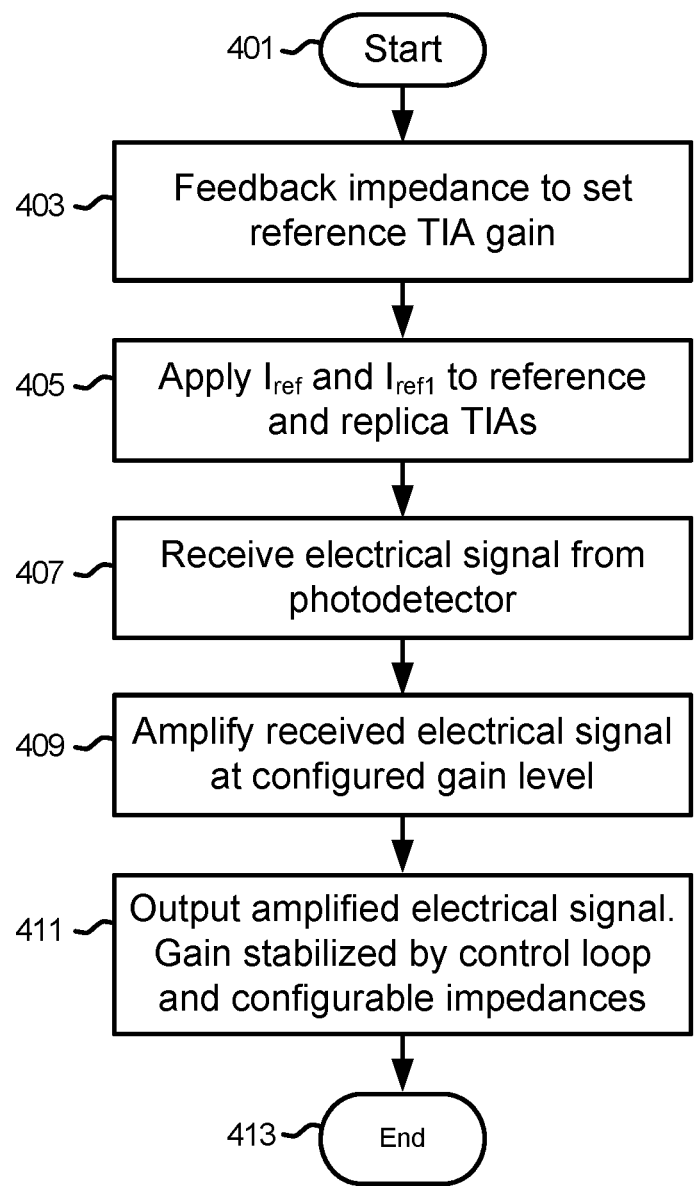
FIG. 4 is a flow chart illustrating example steps in providing process and temperature compensation in a transimpedance amplifier using a dual replica and servo loop, in accordance with an example embodiment of the disclosure.

FIG. 4 is a flow chart illustrating example steps in providing process and temperature compensation in a transimpedance amplifier using a dual replica and servo loop, in accordance with an example embodiment of the disclosure. In step 403, after start step 401, the feedback impedance of TIA 310A may be configured by the fixed feedback impedance for the reference TIA. The reference feedback impedance may comprise a trimmed resistor enabling a post-fabrication, accurate resistance configuration compensating for any process variation across wafers. In step 405, reference currents $I_{ref}$ and $I_{refl}$ may be applied to reference and replica TIAs 310A and 310B. In step 407, an electrical signal may be received from the photodetector 301, thereby generating an electrical signal, which may be amplified by TIA 310C in step 409. In addition, a control current may be supplied to the main TIA 310C to provide a configurable DC output, thereby enabling a pseudo-differential output. In step 411, the amplified and pseudo-differential signal may be communicate at the output of the main TIA 310C. The control loop and configurable impedances may compensate for temperature changes during operation, followed by end step 413.

In an example embodiment, a method and system are disclosed for process and temperature compensation in a transimpedance amplifier using a dual replica and servo loop. In this regard, aspects of the disclosure may comprise a transimpedance amplifier (TIA) circuit comprising a first TIA, a second TIA, a third TIA, and a control loop. The first TIA comprises a fixed feedback resistance and the second and third TIAs each comprise a configurable feedback impedance. The control loop comprises a gain stage with inputs coupled to outputs of the first and second TIAs and with an output coupled to the configurable feedback impedance of the second and third TIAs. The TIA circuit may be operable to, for example, configure a gain level of the first TIA based on the fixed feedback resistance and a reference current applied at an input to the first TIA, configure a gain level of the second and third TIAs based on a control voltage generated by the gain stage, and amplify a received electrical current to generate an output voltage using the third TIA.

The reference current may generate a reference voltage at one of the inputs of the gain stage. The reference voltage may control the output of the gain stage that is coupled to the configurable feedback impedances of the second and third TIAs. Gain level changes with temperature of the second and third TIAs may be compensated for, utilizing the configurable feedback impedances of the second and third TIAs, respectively. The configurable impedances of the second and third TIAs each may comprise a fixed resistor and a voltage-controlled resistance. The configurable impedances of the second and third TIAs may be configured by configuring a gate voltage of a transistor of the voltage-controlled resistance utilizing the output of the gain stage. The output voltage may be coupled to a first input of a second gain stage wherein a second input of the second gain stage is coupled to an output of a fourth TIA. A differential signal may be generated utilizing the output voltage and an output of the fourth TIA. The output of the second gain stage may be configured by configuring an input current of the third TIA. The electrical signal may be received from a photodetector.

In another example embodiment, a system is disclosed for process and temperature compensation in a transimpedance amplifier using a dual replica and servo loop. In this regard, aspects of the disclosure may comprise a transimpedance amplifier (TIA) circuit comprising a first TIA comprising a fixed feedback resistor and an output coupled to a first input of a first gain stage; a second TIA comprising a first configurable impedance and an output coupled to a second input to the first gain stage; a third TIA comprising a second configurable feedback impedance, an input for receiving an input electrical current, and an output that generates an output voltage of the TIA circuit; and a control loop that stabilizes the gain of the third TIA with temperature change, where the control loop comprises the first gain stage with its output coupled to the first and second configurable impedances.

As utilized herein the terms "circuits" and "circuitry" refer to physical electronic components (i.e. hardware) and any software and/or firmware ("code") which may configure the hardware, be executed by the hardware, and/or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:
1. A method comprising:
   configuring a first gain level of a first TIA (transimpedance amplifier), wherein the first gain level comprises a constant gain level;
   dynamically configuring a second gain level of a second TIA and a third TIA via respective active feedback impedances based on a control voltage; and
   amplifying a received electrical current to generate an output voltage using the third TIA according to the second gain level.

2. The method of claim 1, further comprising:
monitoring the output of the first TIA and the second TIA; and
configuring the first gain level of the first TIA based on a configurable feedback impedance.

3. The method of claim 1, further comprising:
monitoring the output of the first TIA and the second TIA; and
configuring the first gain level of the first TIA based on a fixed feedback resistance of the first TIA and a reference current applied at an input to the first TIA.

4. The method of claim 1, wherein the active feedback impedance of the second TIA includes an array of selectable resistors.

5. The method of claim 1, wherein a first output of the first TIA and a second output of the second TIA are coupled to the active feedback impedance of the second TIA.

6. The method of claim 1, further comprising:
compensating for changes in the second gain level due to a temperature of the second TIA via the active feedback impedance of the second TIA.

7. The method of claim 1, wherein the active feedback impedance includes a fixed resistor and a voltage-controlled resistance.

8. The method of claim 1, wherein the active feedback impedance of the third TIA includes a resistor in series with a transistor.

9. A transimpedance amplifier (TIA) circuit comprising:
a first TIA, a second TIA, and a third TIA, the first TIA, the second TIA and the third TIA each comprising a configurable feedback impedance, the configurable feedback impedances of the second TIA and the third TIA are both active feedback impedances; and
a control loop configured to:
configure a first gain level of a first TIA, wherein the first gain level comprises a constant gain level;
dynamically configure a second gain level of the second TIA and a third TIA via their respective active feedback impedances based on a control voltage; and
amplify a received electrical current to generate an output voltage using the third TIA according to the second gain level.

10. The TIA circuit of claim 9, further comprising a gain stage including:
a first gain input coupled to a first output of the first TIA;
a second gain input coupled to a second output of the second TIA; and
a gain output coupled to the configurable feedback impedance of the second TIA and the third TIA.

11. The TIA circuit of claim 10, wherein a reference current generates a reference voltage at one of the first gain input and the second gain input.

12. The TIA circuit of claim 11, wherein the reference voltage controls the gain output.

13. The TIA circuit of claim 9, wherein the control loop is further configured to compensate for changes in the second gain level based on temperature changes in at least one of the second TIA and the third TIA via the configurable feedback impedance.

14. The TIA circuit of claim 9, wherein the configurable feedback impedance comprises:
a fixed resistor and a voltage-controlled resistance.

15. The TIA circuit of claim 9, wherein the configurable feedback impedance is configurable via a gate voltage of a transistor of a voltage-controlled resistance.

16. A control loop configured to:
configure a first gain level of a first transimpedance amplifier (TIA), wherein the first gain level comprises constant gain level;
dynamically configure a second gain level of a second TIA and a third TIA via respective active feedback impedances based on a control voltage generated by the control loop, wherein the active feedback impedance of the second TIA includes a fixed resistor and a voltage-controlled resistance; and
amplify a received electrical current to generate an output voltage using the third TIA.

17. The control loop of claim 16, further configured to:
monitoring the output of the first TIA and the second TIA; and
configuring the first gain level of the first TIA based on a configurable feedback impedance.

18. The control loop of claim 16, wherein a first output of the first TIA and a second output of the second TIA are coupled to the active feedback impedance of the second TIA.

19. The control loop of claim 16, further configured to:
compensate for changes in the second gain level due to a temperature of the second TIA via the active feedback impedance of the second TIA.

20. The control loop of claim 16, wherein the active feedback impedance of the third TIA includes an array of selectable resistors.

* * * * *

UNITED STATES PATENT AND TRADEMARK OFFICE
CERTIFICATE OF CORRECTION

PATENT NO. : 11,973,471 B2
APPLICATION NO. : 18/158791
DATED : April 30, 2024
INVENTOR(S) : Stefan Barabas et al.

Page 1 of 1

It is certified that error appears in the above-identified patent and that said Letters Patent is hereby corrected as shown below:

In the Specification

In Column 6, Line 40, delete "silicon-germ anium" and insert -- silicon-germanium --.

In Column 7, Line 34, delete "3106," and insert -- 310B, --.

In Column 7, Line 46, delete "3106." and insert -- 310B. --.

In Column 7, Line 55, delete "3106" and insert -- 310B --.

In Column 7, Line 63, delete "3108" and insert -- 310B --.

In Column 8, Line 9, delete "$I_{ref}$may" and insert -- $I_{ref}$ may --.

Signed and Sealed this
Twenty-ninth Day of October, 2024

Katherine Kelly Vidal
*Director of the United States Patent and Trademark Office*